US012112941B2

(12) United States Patent
Kang et al.

(10) Patent No.: US 12,112,941 B2
(45) Date of Patent: Oct. 8, 2024

(54) SELECTIVE LIQUID SLIDING SURFACE AND METHOD OF FABRICATING THE SAME

(71) Applicant: THE INDUSTRY & ACADEMIC COOPERPATION IN CHUNGNAM NATIONAL UNIVERSITY (IAC), Daejeon (KR)

(72) Inventors: Seong Min Kang, Gwangmyeong-si (KR); Ji Seong Choi, Daejeon (KR)

(73) Assignee: THE INDUSTRY & ACADEMIC COOPERAPATION IN CHUNGNAM NATIONAL UNIVERSITY (IAC), Daejeon (KR)

(*) Notice: Subject to any disclaimer, the term of this patent is extended or adjusted under 35 U.S.C. 154(b) by 235 days.

(21) Appl. No.: 17/764,223

(22) PCT Filed: Aug. 31, 2020

(86) PCT No.: PCT/KR2020/011661
§ 371 (c)(1),
(2) Date: Mar. 28, 2022

(87) PCT Pub. No.: WO2021/075708
PCT Pub. Date: Apr. 22, 2021

(65) Prior Publication Data
US 2022/0344148 A1    Oct. 27, 2022

(30) Foreign Application Priority Data
Oct. 15, 2019    (KR) ........................ 10-2019-0127454

(51) Int. Cl.
H01L 21/02    (2006.01)
B01L 3/00    (2006.01)
(Continued)

(52) U.S. Cl.
CPC .... *H01L 21/0212* (2013.01); *B01L 3/502707* (2013.01); *B01L 3/502746* (2013.01);
(Continued)

(58) Field of Classification Search
CPC ... H01L 21/02; H01L 21/027; H01L 21/3213; H01L 21/311; H01L 21/677;
(Continued)

(56) References Cited

U.S. PATENT DOCUMENTS

| 5,514,621 A | 5/1996 | Tabara |
| 2003/0162395 A1* | 8/2003 | Trapp ................ H01L 21/31144 257/E21.252 |
| 2006/0121678 A1 | 6/2006 | Brask et al. |

FOREIGN PATENT DOCUMENTS

| JP | 06-029311 A | 2/1994 |
| JP | 2008-523591 A | 7/2008 |

(Continued)

OTHER PUBLICATIONS

KR101025696 English machine translation, prepared Feb. 26, 2024 (Year: 2024).*
International Search Report of PCT/KR2020/011661 mailed Feb. 4, 2021.

Primary Examiner — Christopher M Rodd
Assistant Examiner — Shibin Liang
(74) Attorney, Agent, or Firm — Revolution IP, PLLC

(57) ABSTRACT

A selective liquid sliding surface includes: a base layer; multiple pillars protruding from the base layer; and a head protruding from an upper surface of each of the multiple pillars and having a larger cross-sectional diameter than the pillar, wherein the head includes a first head protruding from the pillar and a second head protruding from a periphery of the first head, and the base layer, the pillar, and the head are formed of the same material.

5 Claims, 14 Drawing Sheets

(51) Int. Cl.
*C23C 16/40* (2006.01)
*H01L 21/027* (2006.01)
*H01L 21/3065* (2006.01)
*H01L 21/311* (2006.01)
*H01L 21/3205* (2006.01)
*H01L 21/3213* (2006.01)

(52) U.S. Cl.
CPC ...... *C23C 16/402* (2013.01); *H01L 21/02164* (2013.01); *H01L 21/02274* (2013.01); *H01L 21/0273* (2013.01); *H01L 21/3065* (2013.01); *H01L 21/31116* (2013.01); *H01L 21/32055* (2013.01); *H01L 21/32137* (2013.01); *B01L 2300/12* (2013.01); *B01L 2300/166* (2013.01); *B01L 2400/088* (2013.01)

(58) Field of Classification Search
CPC ... H01L 21/0212; H01L 21/302; C23C 16/04; H02L 21/3065; B01L 3/00
See application file for complete search history.

(56) References Cited

FOREIGN PATENT DOCUMENTS

| KR | 10-2001-0026007 A | 4/2001 | |
|---|---|---|---|
| KR | 10-2002-0057532 A | 7/2002 | |
| KR | 10-1025696 B1 | 3/2011 | |
| KR | 101025696 * | 3/2011 | ........... H01L 21/677 |
| KR | 10-2014-0101193 A | 8/2014 | |

* cited by examiner $\lambda o$ : Capillary force of water
$\lambda w$: Capillary force of oil αs: structural angle

SELECTIVE LIQUID SLIDING SURFACE AND METHOD OF FABRICATING THE SAME

CROSS REFERENCE TO PRIOR APPLICATIONS

This application is the 35 U.S.C. 371 national stage of International application PCT/KR2020/011661 filed on Aug. 31, 2020 which claims priority to Korean Patent Application No. 10-2019-0127454 filed on Oct. 15, 2019. The entire contents of each of the above-identified applications are hereby incorporated by reference.

FIELD

The present invention relates to a selective liquid sliding surface and a method of fabricating the same and, more particularly, to a selective liquid sliding surface which has omniphobicity, that is, a property of being super-repellent to both water and oil, and a selective liquid rolling off property allowing oil to roll off faster than water through a mushroom-shaped surface structure having a reentrant structure at a head thereof contacting a liquid droplet, and a method of fabricating the same.

BACKGROUND

In general, hydrophobicity and oleophobicity refer to properties of a surface that can be resistant to wetting with water and oil, respectively. In the related art, wettability is defined by a contact angle formed between a water droplet (oil droplet) and a surface of a solid object. If the angle is greater than or equal to 150°, the surface is called superhydrophobic (superoleophobic).

In other words, a superhydrophobic (superoleophobic) surface is highly resistant to wetting with water (oil).

Recently, superhydrophobic surfaces with a water contact angle of 150° or greater have attracted considerable attention due to the importance thereof in both basic research and practical applications.

For example, the leaves of plants, the wings of insects, or the wings of birds have properties that can naturally remove any external pollutants or can prevent contamination with external pollutants in the first place.

This is because the leaves of plants, the wings of insects, and the wings of birds have superhydrophobic or superoleophobic properties.

As such, wettability is an important surface property of a solid material and is mainly governed by the chemical composition and geometric micro/nano structure of the material. Non-wettable surfaces have attracted much attention due to potential applications thereof in various fields such as oil-water separation, anti-reflection, anti-bioadhesion, anti-adhesion, anti-fouling, self-cleaning, and suppression of fluid turbulence.

However, most hydrophobic/oleophobic surfaces cannot induce water and oil to selectively slide off, and have difficulty in realizing a larger roll-off angle for water than for oil.

This is because water has a higher surface tension than oil and thus can more easily bounce back from the same surface than oil.

SUMMARY

Embodiments of the present invention are conceived to solve such problems in the art and it is an aspect of the present invention to provide a selective liquid sliding surface which has omniphobicity, that is, a property of being super-repellent to both water and oil, and a selective liquid rolling off property allowing oil to roll off faster than water through a mushroom-shaped surface structure having a reentrant structure at a head thereof contacting a liquid droplet, and a method of fabricating the same.

In accordance with one aspect of the present invention, there is provided a selective liquid sliding surface including: a base layer; multiple pillars protruding from the base layer; and a head protruding from an upper surface of each of the multiple pillars and having a larger cross-sectional diameter than the pillar, wherein the head includes a first head protruding from the pillar and a second head protruding from a periphery of the first head, and the base layer, the pillar, and the head are formed of the same material.

The material forming the base layer, the pillar, and the head may be any one selected from the group consisting of polydimethylsiloxane (PDMS), polyurethane acrylate (PUA), perfluoropolyether (PFPE), polyvinyl chloride (PVC), ethylene vinyl acetate (EVA), polyethylene (PE), polyethylene naphthalate (PEN), polypropylene (PP), polyolefin (PO), polymethyl methacrylate (PMMA), polystyrene (PS), nitrocellulose, acetyl cellulose, polycarbonate (PC), polyethylene terephthalate (PET), acrylonitrile-butadiene-styrene (ABS) resin, polyamide (PA), polyimide (PI), polyethersulfone (PES), polyvinyl acetal, polyetherketone (PEK), triacetylcellulose (TAC), pNIPAAm (poly(N-isopropylacrylamide)), Norland Optical Adhesive (NOA), and polyurethane (PU).

In accordance with another aspect of the present invention, there is provided a method of fabricating a selective liquid sliding surface, the method including: a mushroom-shaped silicone mold fabrication step in which a mushroom-shaped silicone mold is fabricated; a mushroom-shaped structure formation step in which the mushroom-shaped silicone mold is filled with a polymer material, followed by curing; and a surface fabrication step in which a surface having mushroom-shaped structures is fabricated by separating the mushroom-shaped silicone mold from the polymer material, wherein the mushroom-shaped silicone mold fabrication step includes: a photoresist layer formation step in which a photoresist layer is formed on an upper surface of a silicon wafer; a first etching step in which the photoresist layer is etched in a pattern of multiple rings arranged at regular intervals and the upper surface of the silicon wafer is etched into multiple ring-shaped trenches using the etched photoresist layer as a mask; a photoresist layer removal step in which the photoresist layer is removed; a polysilicon layer formation step in which a silicon oxide layer is deposited on the silicon wafer and a polysilicon layer is formed on the silicon oxide layer; a second etching step in which the entire region of the polysilicon layer excluding circular regions each corresponding to an outer periphery of a corresponding one of the multiple ring-shaped trenches is etched; a silicon dioxide layer formation step in which a silicon dioxide layer is formed on the silicon oxide layer and the polysilicon layer; a third etching step in which circular regions of the silicon dioxide layer corresponding to the respective multiple ring-shaped trenches are etched; and a polysilicon layer removal step in which the polysilicon layer is removed.

The method may further include, after the surface fabrication step, a $C_4F_8$ deposition step in which octafluorocyclobutane ($C_4F_8$) is deposited on the mushroom-shaped structures.

The mushroom-shaped structure formation step may include: a casting step in which etched regions of the silicon wafer, the polysilicon layer, and the silicon dioxide layer of the mushroom-shaped silicone mold are filled with the polymer material; and a curing step in which the polymer material is cured.

Each of the multiple ring-shaped trenches formed in the first etching step corresponds to a periphery of a corresponding one of the circular regions in the second etching step, and the circular regions in the second etching step may have a larger diameter than the circular regions etched in the third etching step.

The polymer material used in the mushroom-shaped structure formation step may be any one selected from the group consisting of polydimethylsiloxane (PDMS), polyurethane acrylate (PUA), perfluoropolyether (PFPE), polyvinyl chloride (PVC), ethylene vinyl acetate (EVA), polyethylene (PE), polyethylene naphthalate (PEN), polypropylene (PP), polyolefin (PO), polymethyl methacrylate (PMMA), polystyrene (PS), nitrocellulose, acetyl cellulose, polycarbonate (PC), polyethylene terephthalate (PET), acrylonitrile-butadiene-styrene (ABS) resin, polyamide (PA), polyimide (PI), polyethersulfone (PES), polyvinyl acetal, polyetherketone (PEK), triacetylcellulose (TAC), pNIPAAm (poly(N-isopropylacrylamide)), Norland Optical Adhesive (NOA), and polyurethane (PU).

The selective liquid sliding surface and the method of fabricating the same according to the present invention provide the following effects.

First, the selective liquid sliding surface can have omniphobicity, that is, a property of being super-repellent to both water and oil, and a selective liquid rolling off property allowing oil to roll off faster than water through the mushroom-shaped surface structure having a reentrant structure at a head thereof contacting a liquid droplet.

Secondly, due to the selective liquid rolling off property allowing oil to roll off faster than water, the selective liquid sliding surface can be advantageously used in microfluidic channels or biosignal transmission chips.

DRAWINGS

The above and other aspects, features, and advantages of the present invention will become apparent from the detailed description of the following embodiments in conjunction with the accompanying drawings.

DETAILED DESCRIPTION

Figure 1:
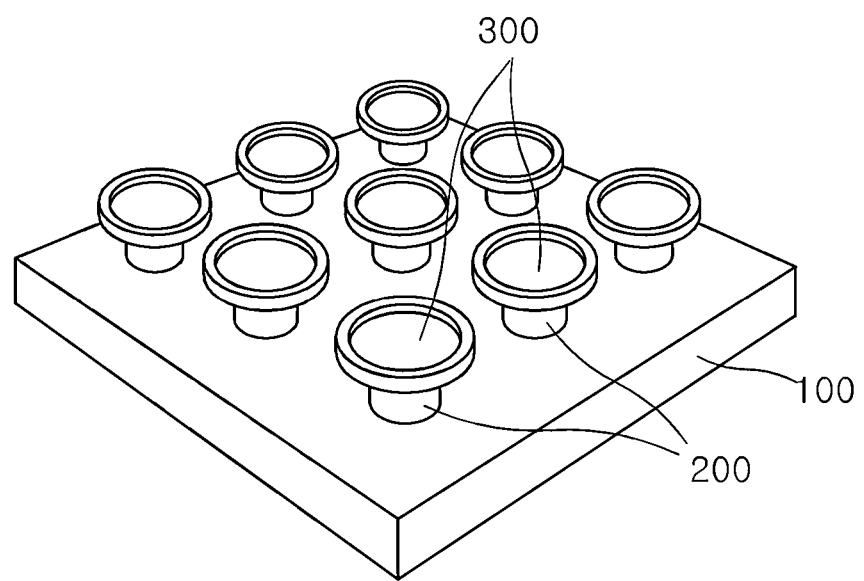
FIG. 1 is a schematic view of a selective liquid sliding surface according to the present invention.

Hereinafter, preferred embodiments of the present invention will be described with reference to the accompanying drawings. In description of the embodiments, the same components will be denoted by the same terms and the same reference numerals and repeated description thereof will be omitted.

A selective liquid sliding surface according to the present invention will be described with reference to FIG. 1 to FIG. 5.

Figure 2:
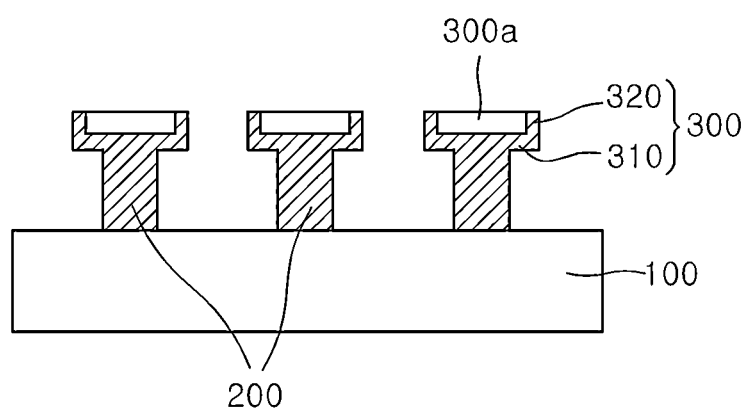
FIG. 2 is a sectional view of the selective liquid sliding surface according to the present invention.
Figure 3:
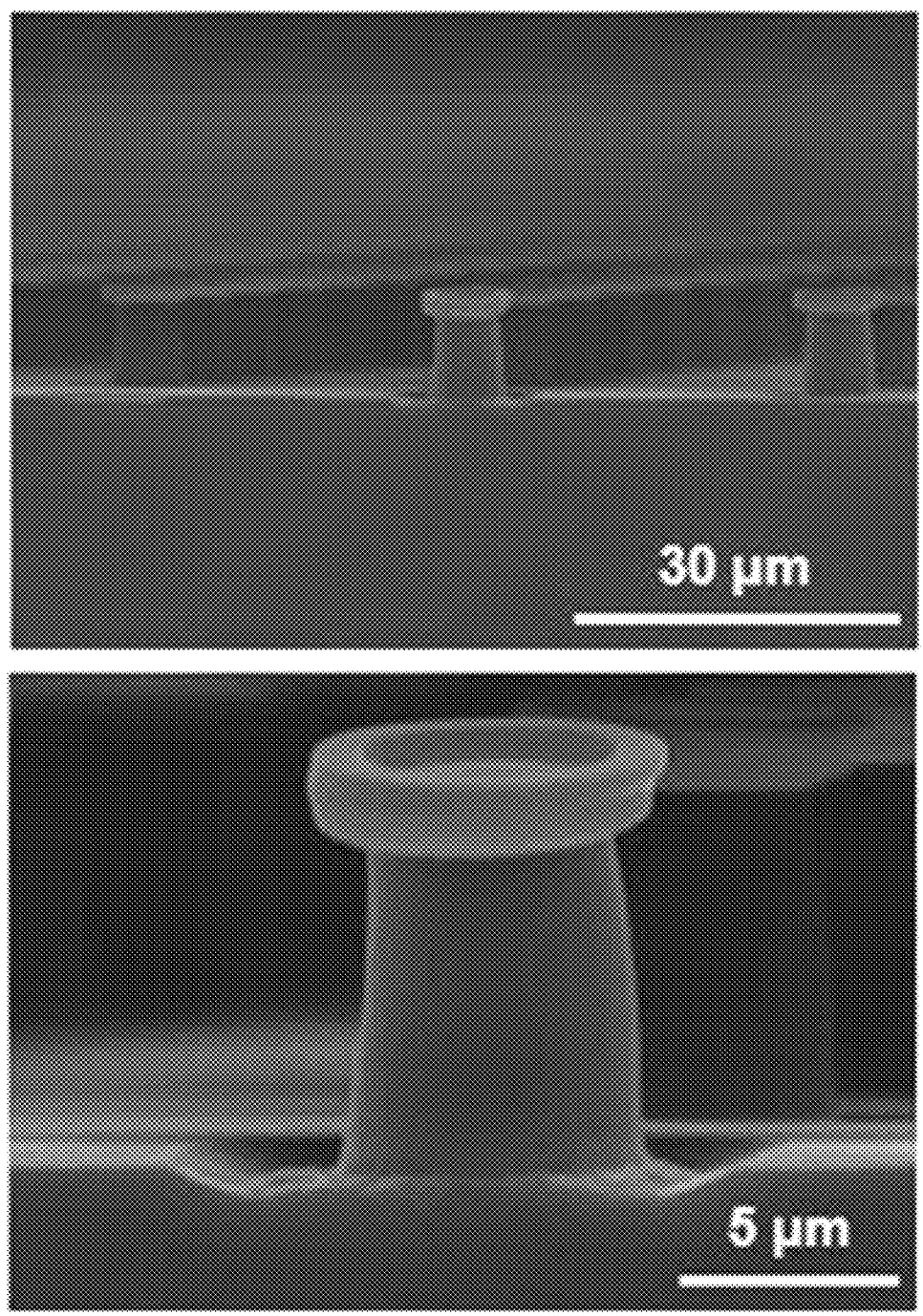
FIG. 3 is a view showing an SEM image of the selective liquid sliding surface according to the present invention.

Referring to FIG. 1 to FIG. 3, the selective liquid sliding surface according to the present invention includes a base layer 100, multiple pillars 200, and multiple heads 300.

The pillars 200 protrude from an upper surface of the base layer 100 and are arranged at intervals of 20 μm to 50 μm. Each of the pillars 200 has a diameter of 5 μm to 10 μm and a height of 5 μm to 15 μm.

Each of the heads 300 protrudes from an upper surface of a corresponding one of the pillars 200 and has a larger cross-sectional diameter than the pillar 200.

Specifically, the head 300 includes a first head 310 and a second head 320.

The first head 310 is connected to the upper surface of the pillar 200, has a circular cross-section, and has a larger cross-sectional diameter than the pillar 200.

The second head 320 protrudes from a periphery of the upper surface of the first head 310. That is, the second head 320 has an annular cross-section, and may have an outer cross-sectional diameter equal to the cross-sectional diameter of the first head 310 and an inner cross-sectional diameter larger than or equal to the cross-sectional diameter of the pillar 200. Alternatively, the second head 320 may have an inner cross-sectional diameter smaller than the cross-sectional diameter of the pillar 200.

As a result, the first head 310 and the second head 320 constituting the head 300 define a groove 300a at a center of the upper surface of the head 300. Due to the groove 300a, the selective liquid sliding surface according to the present invention can have omniphobicity, that is, can be super-repellant to both water and oil, while having a selective liquid rolling off property allowing oil to roll off faster than water, which will be described in detail further below.

The base layer 100, the pillar 200, and the head 300 may be formed of the same material. For example, the material forming the base layer, the pillar, and the head may be one selected from the group consisting of polydimethylsiloxane (PDMS), polyurethane acrylate (PUA), perfluoropolyether (PFPE), polyvinyl chloride (PVC), ethylene vinyl acetate (EVA), polyethylene (PE), polyethylene naphthalate (PEN), polypropylene (PP), polyolefin (PO), polymethyl methacrylate (PMMA), polystyrene (PS), nitrocellulose, acetyl cellulose, polycarbonate (PC), polyethylene terephthalate (PET), acrylonitrile-butadiene-styrene (ABS) resin, polyamide (PA), polyimide (PI), polyethersulfone (PES), polyvinyl acetal, polyetherketone (PEK), triacetylcellulose (TAC), pNIPAAm (poly(N-isopropylacrylamide)), Norland Optical Adhesive (NOA), and polyurethane (PU).

However, it should be understood that the present invention is not limited thereto, and the base layer 100, the pillar 200, and the head 300 may be formed of any other polymer material that has good releasability and flexibility.

Next, the meniscus of water and the meniscus of oil on the selective liquid sliding surface according to the present invention will be compared with reference to FIG. 4. Herein, deionized water and mineral oil are used to compare the meniscus of water and the meniscus of oil.

Figure 4A:
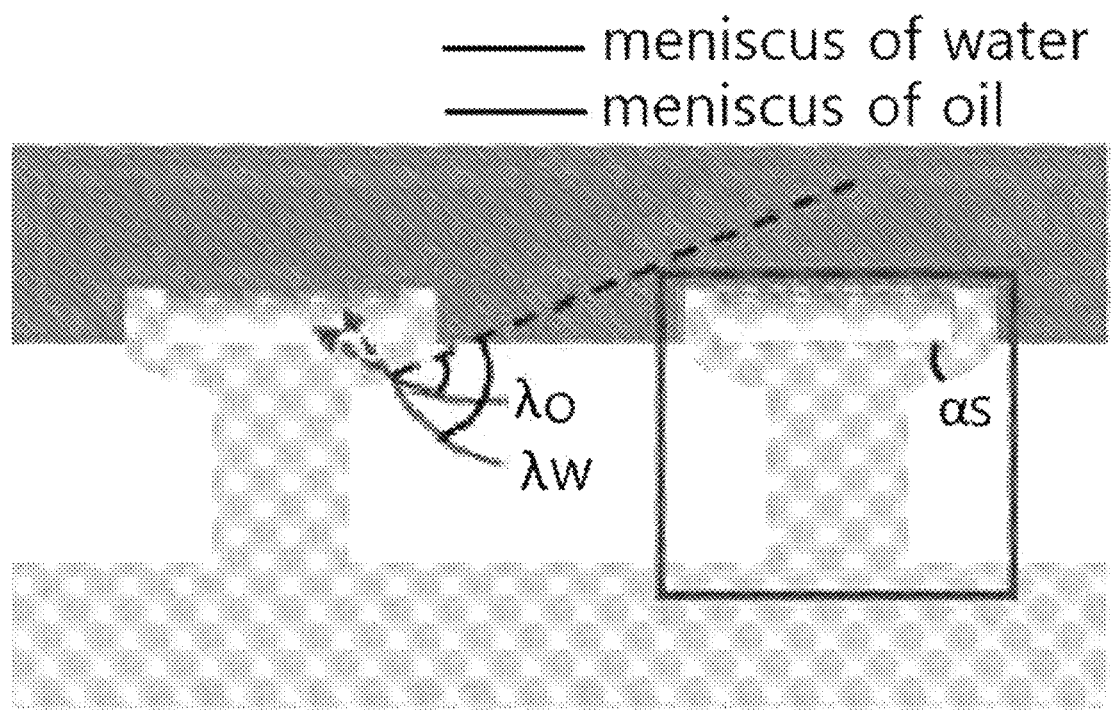
FIGS. 4A-4F show comparison of the meniscus of deionized water and the meniscus of mineral oil according to the shape of a head of the selective liquid sliding surface according to the present invention.

FIG. 4(a) shows the menisci of deionized water and mineral oil due to the shapes of the pillar 200 and the head 300 formed on the upper surface of the base layer 100. The meniscus of a liquid depends on the equilibrium angle $\theta_0$ of the liquid and the angle $\alpha$ of a microstructure of a surface. In order to allow capillary force to act on various liquids, the angle $\alpha$ of the microstructure needs to be smaller than the equilibrium angle.

Figure 4B:
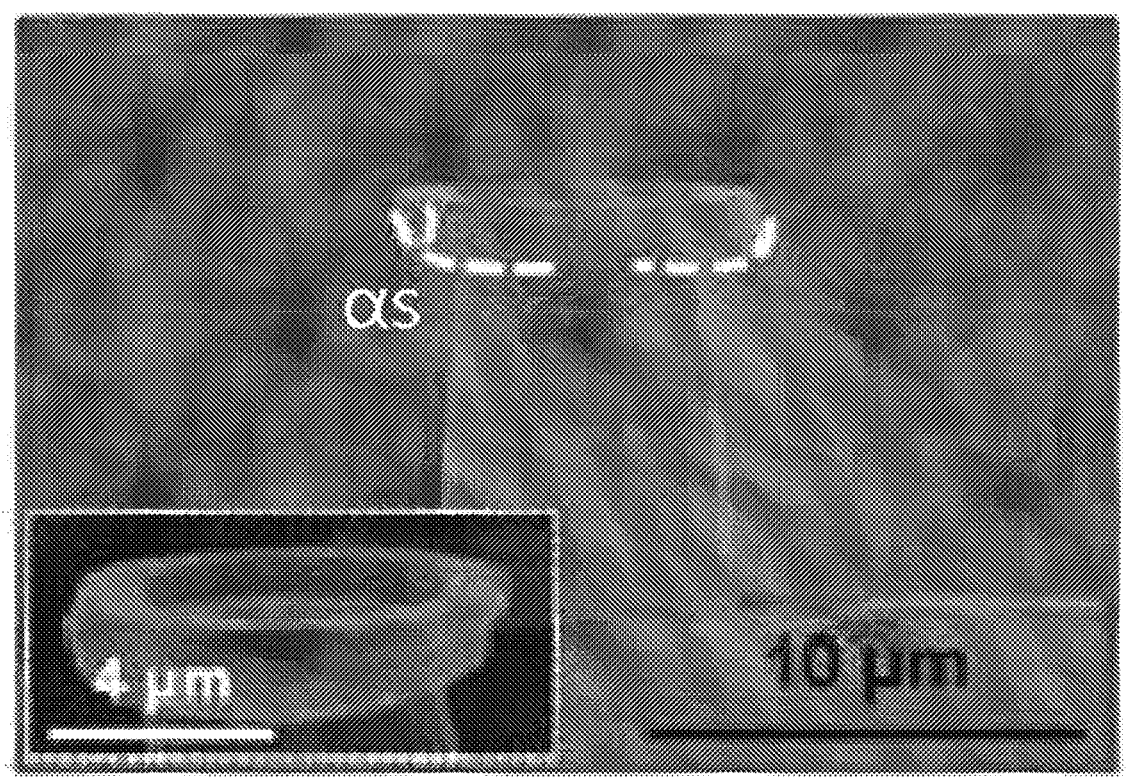

Referring to FIG. 4(b), it can be seen that the angle $\alpha$ of a microstructure defined by the head 300 on the selective liquid sliding surface according to the present invention is suitable for providing omniphobicity, that is, repellency to various liquids with different surface tensions (that is, different equilibrium angles).

Figure 4C:
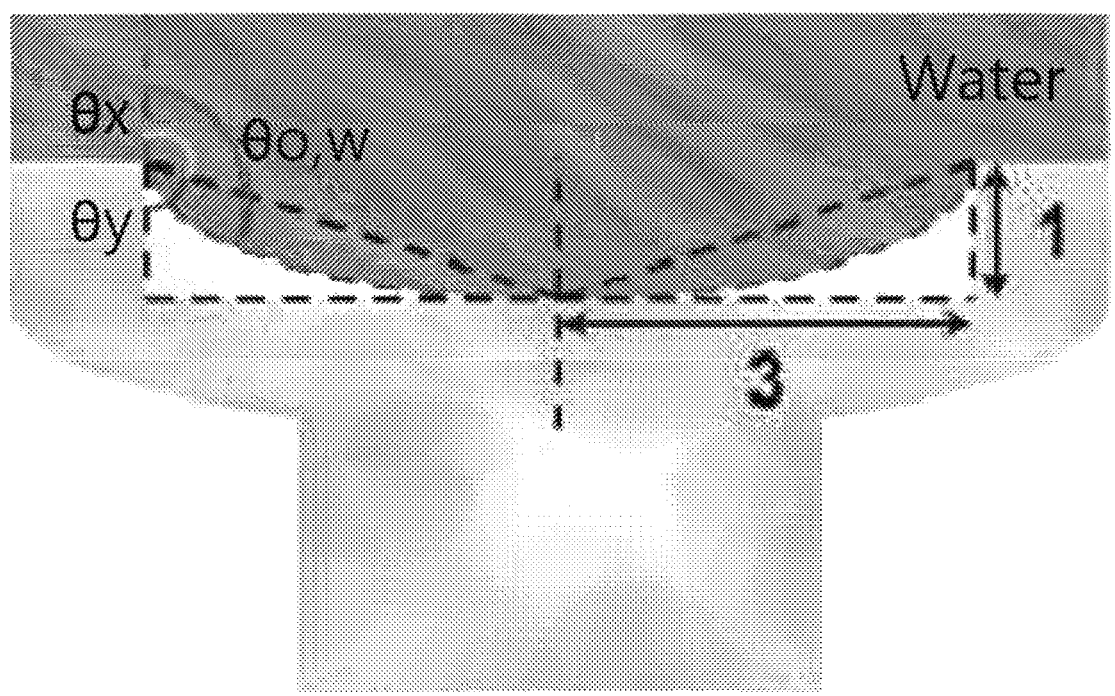
Figure 4D:
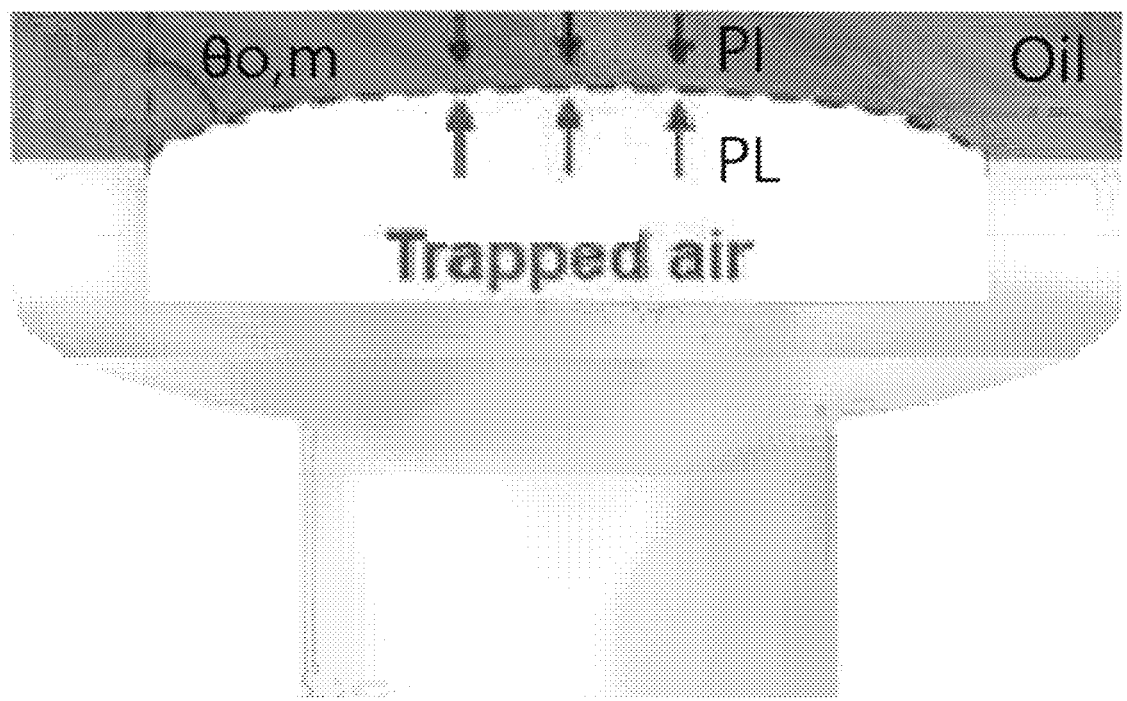

In addition, referring to FIG. 4(c) and FIG. 4(d), a selective liquid (deionized water/mineral oil) sliding property of the selective liquid sliding surface according to the present invention can be explained by meniscus behavior on the structure defined by the pillar 200 and the head 300.

$\theta_x$ may be calculated from geometrical characteristics of the head 300 due to the groove 300a formed at the center of the upper surface of the head 300. Here, $\theta_x$ plays a critical role in determining whether the meniscus of a liquid contacts the surface of the groove 300a.

According to the present invention, $\theta_x$ has a value of about 109°, which may be calculated according to Relation: $\theta_x + \theta_y = 180°$, where $\tan(\theta_y) = 3$, as shown in FIG. 4(c).

Since the equilibrium angle ($\theta_{o,w}$: 116.2°) is greater than $\theta_x$, as shown in FIG. 4(c), the meniscus of deionized water contacts the surface of the groove 300a of the head 300, whereas the meniscus of mineral oil allows a convex air layer to be formed on the groove 300a of the head 300, as shown in FIG. 4(d).

That is, when mineral oil is placed on the selective liquid sliding surface according to the present invention, an air layer is formed on the groove 300a of the head 300 due to stable repulsive force caused by balance of Laplace pressure (PL) and internal gravity (PI).

Figure 4E:
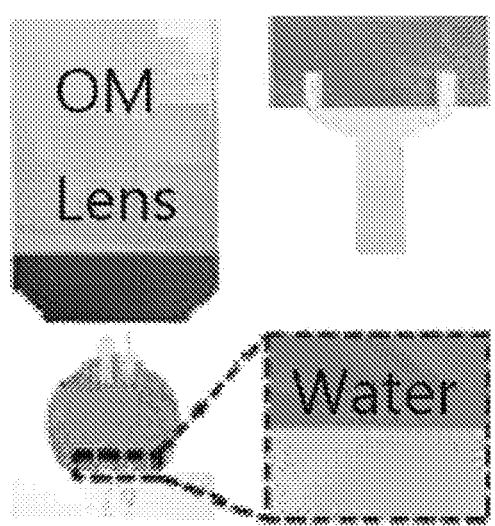
Figure 4E:
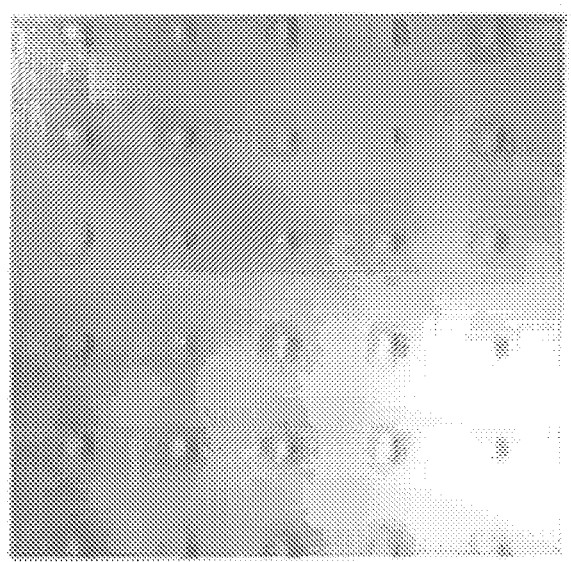
Figure 4F:
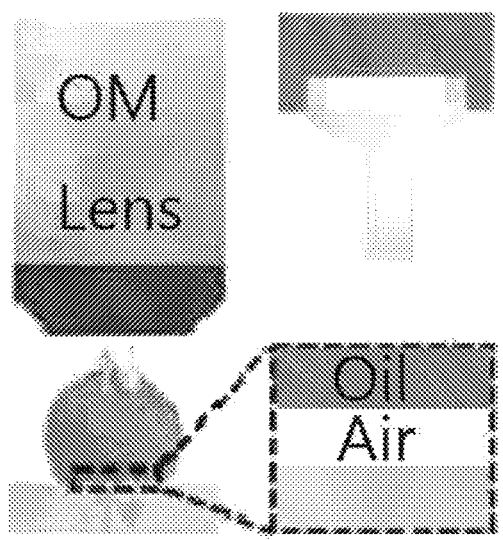
Figure 4F:
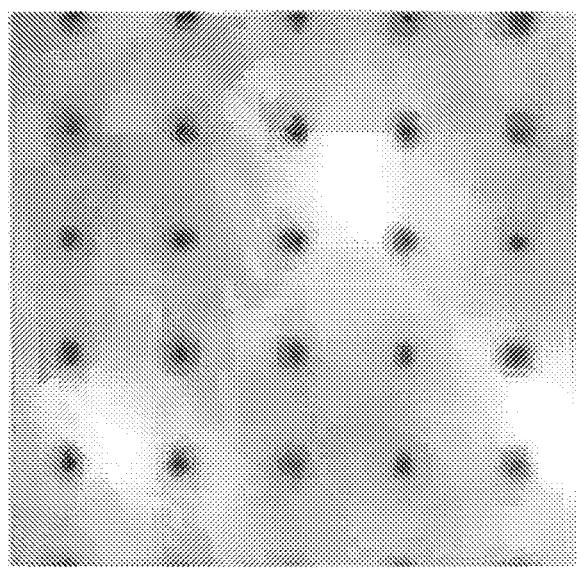

Formation of the air layer on the groove 300a can be confirmed from images of FIG. 4(e) and FIG. 4(f), obtained by dripping deionized water and mineral oil on the selective liquid sliding surface according to the present invention, followed by photography using a microscope.

When droplets of deionized water are placed on the selective liquid sliding surface according to the present invention, light from the microscope is propagated to the entire region of the selective liquid sliding surface according to the invention through the droplets of deionized water contacting the surface of the groove 300a.

Conversely, when droplets of mineral oil are placed on the selective liquid sliding surface according to the present invention, light from the microscope is propagated to the selective liquid sliding surface according to the present invention excluding a region corresponding to the air layer formed on the groove 300a of the head 300. That is, the air layer formed on the groove 300a prevents light from arriving at the selective liquid sliding surface by blocking passage of the light therethrough.

Since the air layer is formed on the groove 300a of the head 300 when mineral oil is placed on the selective liquid sliding surface according to the present invention, the selective liquid sliding surface according to the present invention has a smaller roll-off angle for mineral oil than for deionized water.

FIG. 5 shows measurement of the contact angle and sliding angle of deionized water and mineral oil on the selective liquid sliding surface according to the present invention.

Referring to FIG. 5, the contact angles of deionized water and mineral oil on the selective liquid sliding surface according to the present invention were both measured to be 160° or greater in the temperature range of 0° C. to 100° C. Accordingly, it can be seen that the selective liquid sliding surface according to the present invention is a superomniphobic surface that is super-repellent to both water and oil.

Figure 5A:
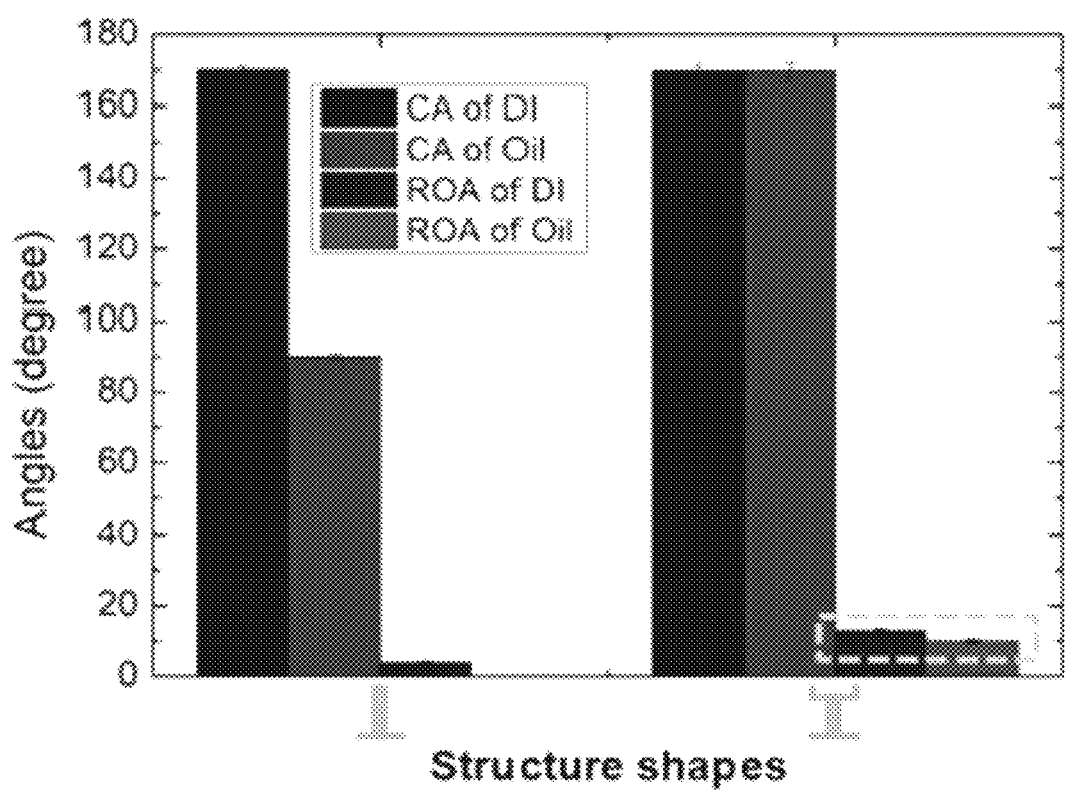
FIG. 5A-5G show results of an experiment to measure the contact angle and sliding angle of water and oil on the selective liquid sliding surface according to the present invention.
Figure 5B:
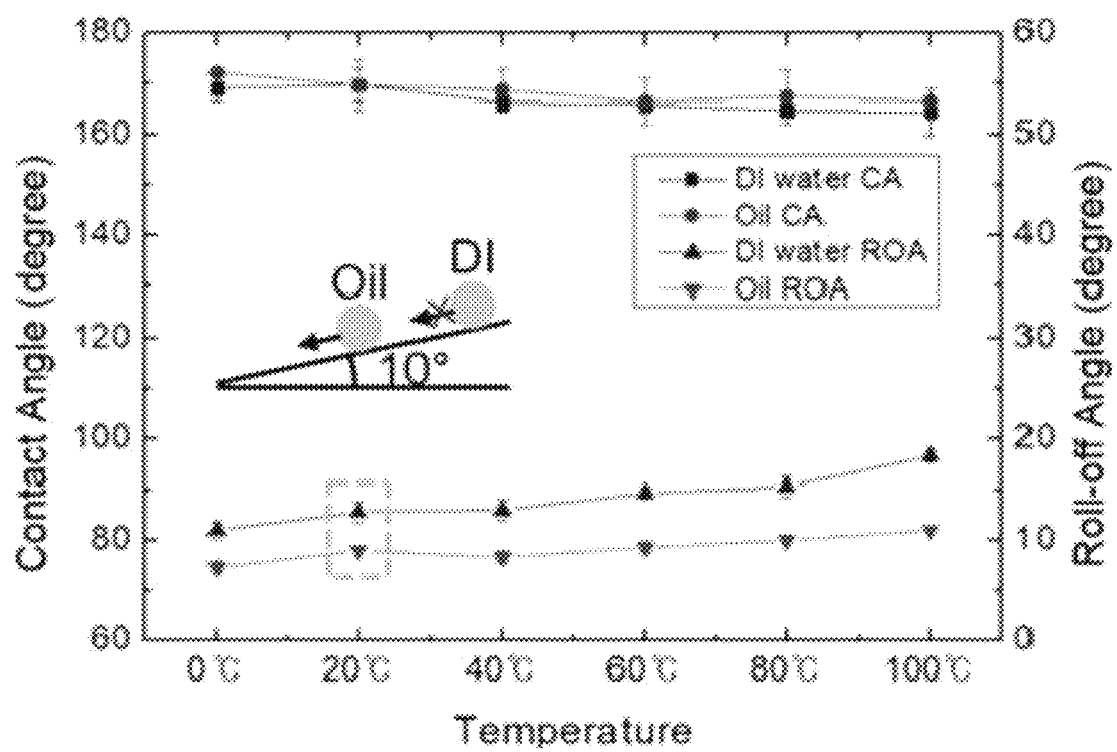
Figure 5C:
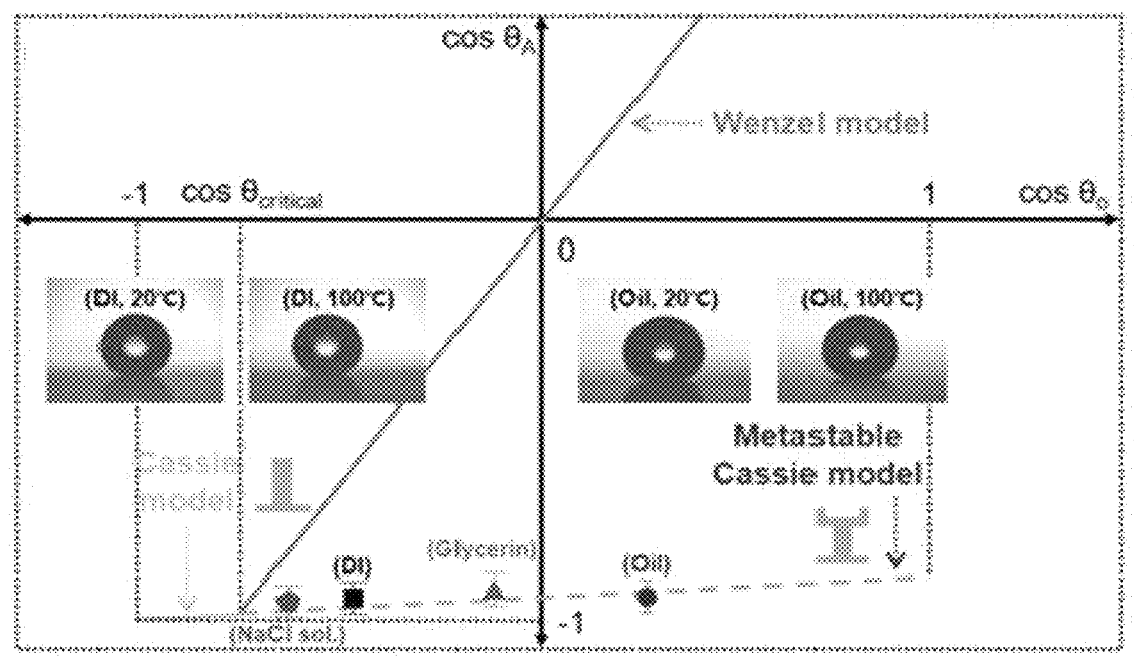
Figure 5D:
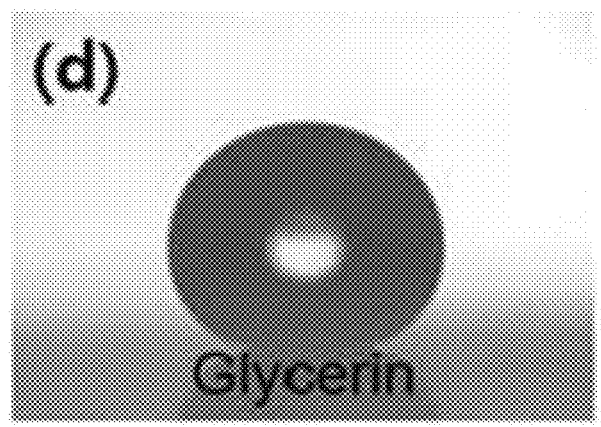
Figure 5E:
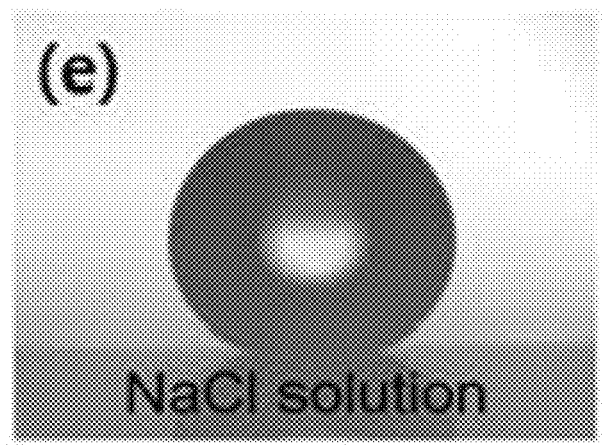
Figure 5F:
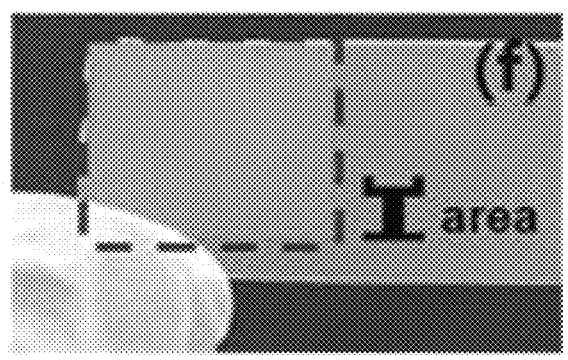
Figure 5G:
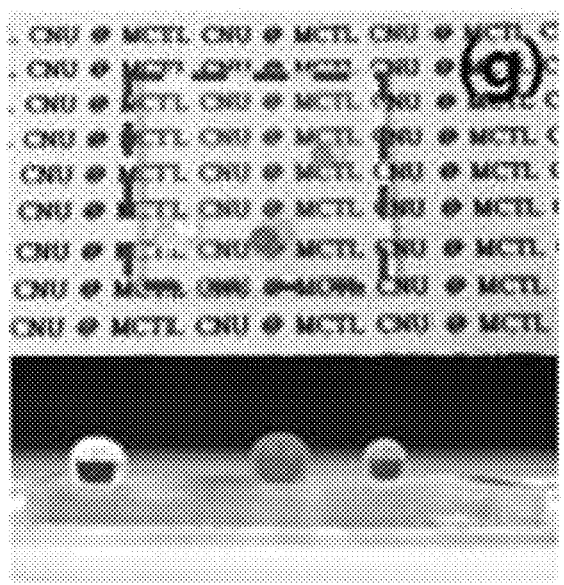
Figure 6:
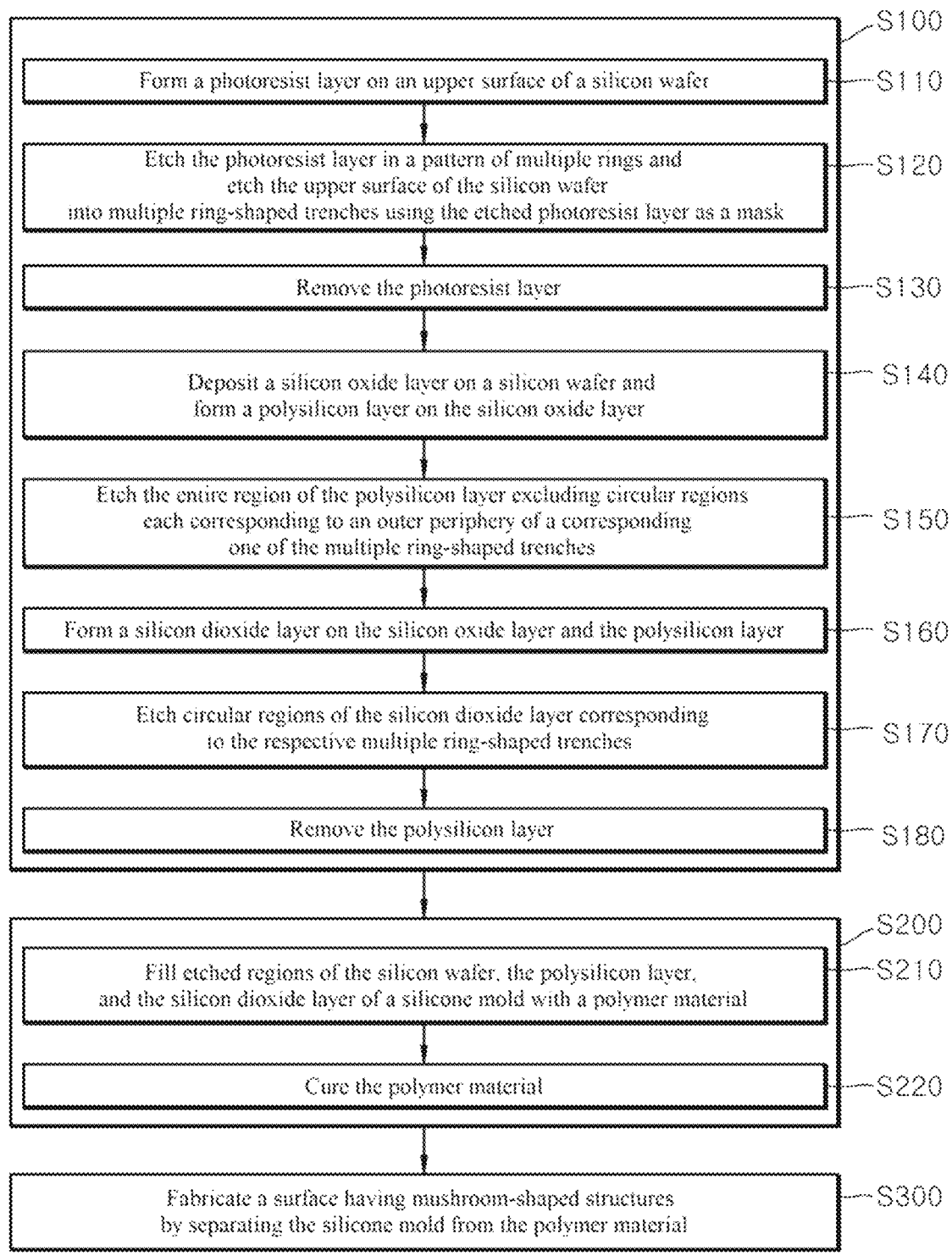
FIG. 6 is a flowchart of a selective liquid sliding surface fabrication method according to the present invention.
Figure 7:
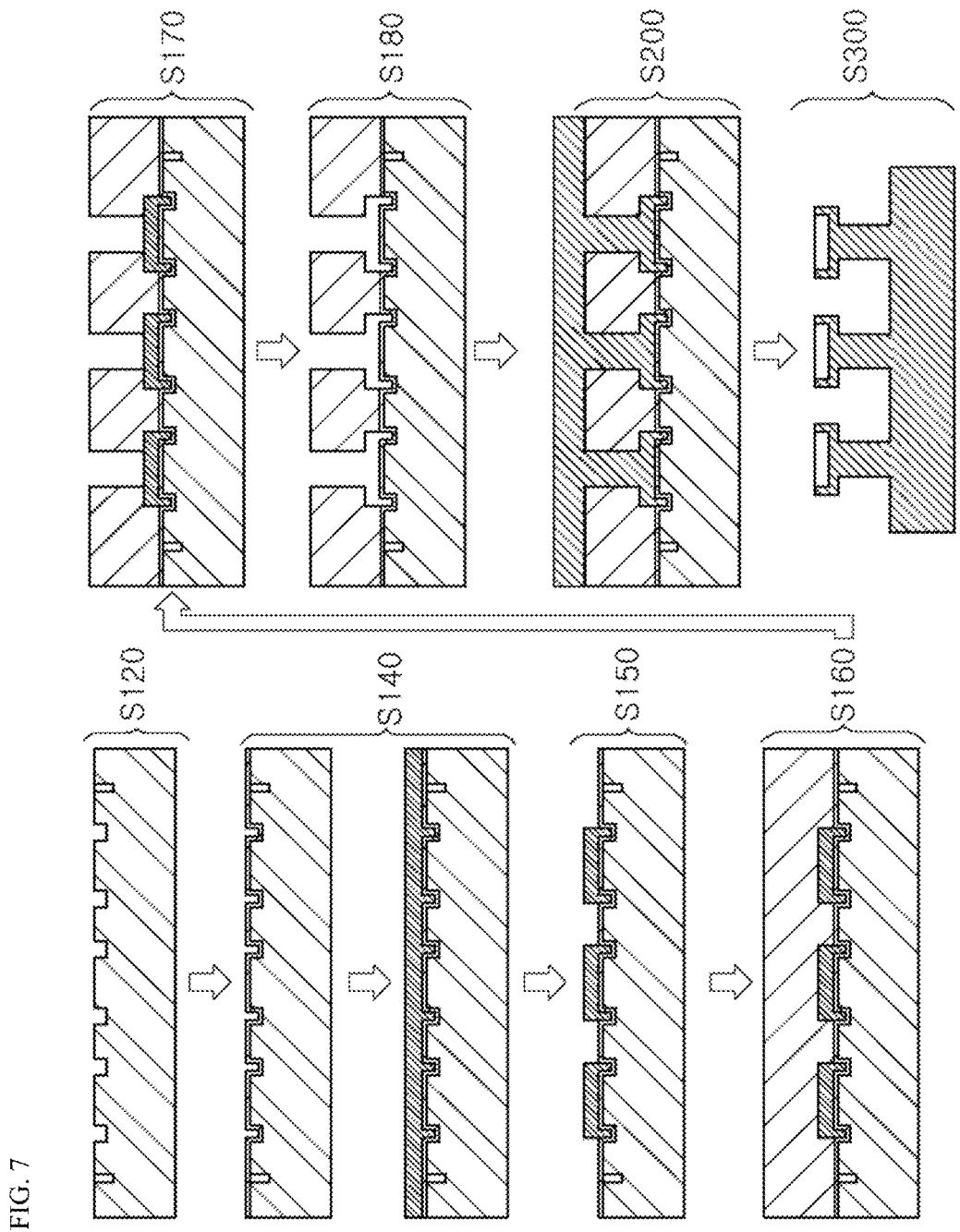
FIG. 7 is a view illustrating steps of the selective liquid sliding surface fabrication method according to the present invention.
Figure 8:
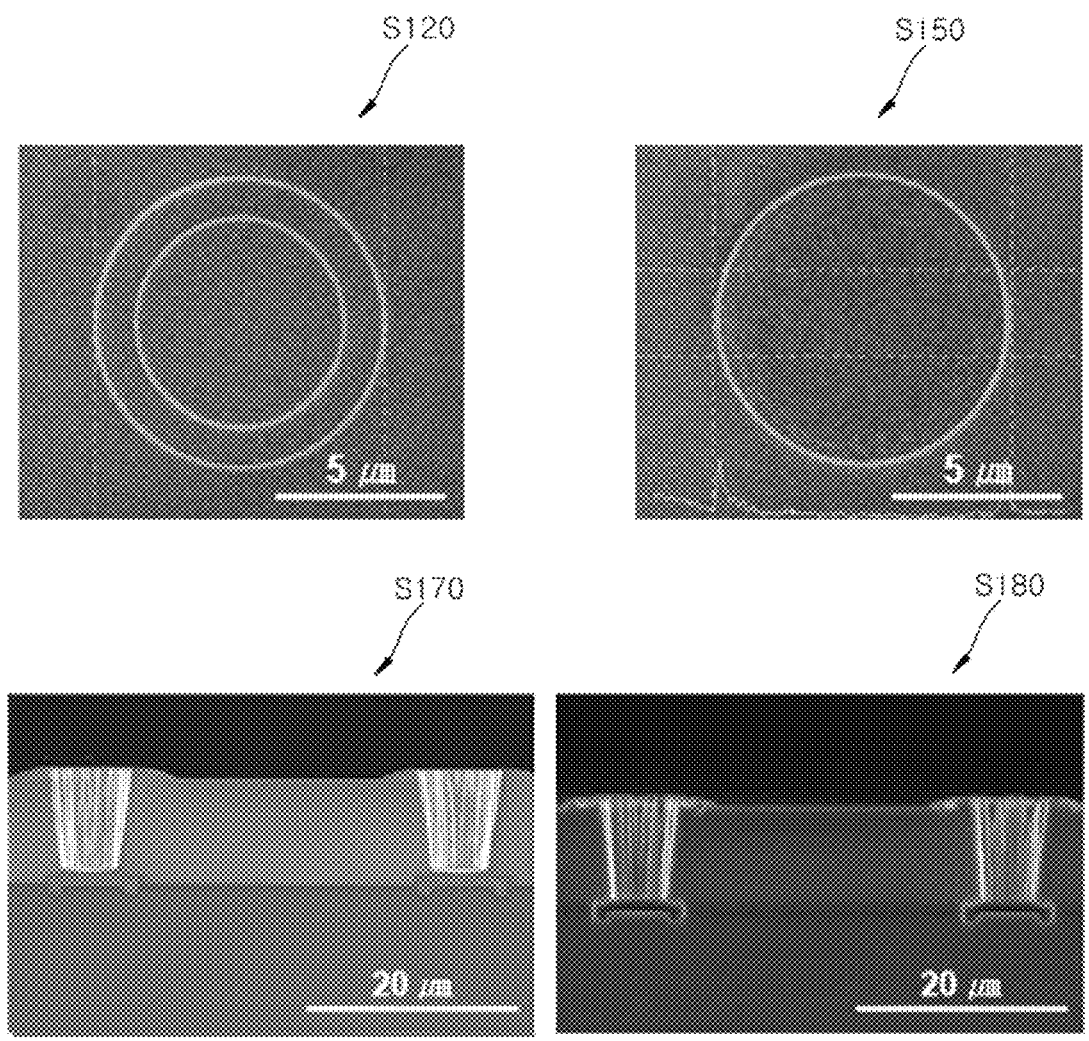
FIG. 8 is an SEM image of a mushroom-shaped silicone mold manufactured by the selective liquid sliding surface fabrication method according to the present invention.

In addition, it can be seen that the selective liquid sliding surface according to the present invention has a smaller roll-off angle (ROA) for mineral oil than for deionized water (see FIG. 5(b)), as described above. That is, due to the head 300 having a reentrant structure, the selective liquid sliding surface according to the present invention has superomniphobicity, that is, a property of being super-repellent to both water and oil, and a selective liquid droplet rolling off property allowing oil to roll off faster than water, and thus can be advantageously used in microfluidic channels, bio-signal transmission chips, and the like.

Next, a selective liquid sliding surface fabrication method according to the present invention will be described with reference to FIG. 1 to FIG. 8.

The selective liquid sliding surface fabrication method includes a mushroom-shaped silicone mold fabrication step S100, a mushroom-shaped structure formation step S200, and a surface fabrication step S300.

In the mushroom-shaped silicone mold fabrication step S100, a mushroom-shaped silicone mold for fabrication of the selective liquid sliding surface according to the present invention is fabricated. Specifically, the mushroom-shaped silicone mold fabrication step S100 includes a photoresist layer formation step S110, a first etching step S120, a photoresist layer removal step S130, a polysilicon layer formation step S140, a second etching step S150, a silicon dioxide layer formation step S160, a third etching step S170, and a polysilicon layer removal step S180.

The method may further include washing a silicon wafer with ethanol and isopropyl alcohol before the photoresist layer formation step S110.

In the photoresist layer formation step S110, a photoresist layer is deposited on an upper surface of the silicon wafer by spin coating. Here, the photoresist layer preferably may have a thickness of at least 2 μm.

Thereafter, in the first etching step S120, the photoresist layer is etched in a pattern of multiple rings arranged at intervals of 30 μm to 50 μm and corresponding in shape to the second head 320. Then, the upper surface of the silicon wafer is etched into ring-shaped trenches each having an outer diameter of 8.5 μm and a depth of 1 μm using the etched photoresist as a mask. Here, the etching process may be performed by dry etching using an inductively coupled plasma (ICP) system.

In the photoresist layer removal step S130, the etched photoresist layer is removed.

The polysilicon layer formation step S140 includes a first step and a second step.

In the first step, a silicon oxide layer is formed by thermally oxidizing the exposed surface of the silicon wafer to a thickness of 200 nm in an $H_2$—$O_2$ atmosphere. The silicon oxide layer formed in the first step serves as an etch-stop layer in the third etching step S170 and the polysilicon layer removal step S180 described below.

Thereafter, in the second step, a polysilicon layer is formed on the entire region of the silicon oxide layer. The polysilicon layer may have a thickness of 1 μm. Here, deposition of the polysilicon layer may be performed by low pressure-chemical vapor deposition (LP-CVD).

In the second etching step S150, the entire region of the polysilicon layer excluding multiple circular regions each corresponding to an outer periphery of a corresponding one of the multiple ring-shaped trenches formed on the upper surface of the silicon wafer is etched. That is, the entire region of the polysilicon layer excluding the circular regions each having an outer diameter of 8.5 μm is etched. Here, the second etching step S150 may be performed by dry etching.

In the silicon dioxide layer formation step S160, a silicon dioxide layer is formed on the polysilicon layer and the silicon oxide layer. The silicon dioxide layer may have a thickness of 10 μm. Here, deposition of the silicon dioxide layer may be performed by plasma enhanced-chemical vapor deposition (PE-CVD).

In the third etching step S170, multiple circular regions of the silicon dioxide layer corresponding to respective multiple ring-shaped trenches are etched. The circular regions etched in the third etching step S170 may have a smaller diameter than the circular regions formed in the second etching step S150. In other words, each of the ring-shaped trenches formed in the first etching step S120 corresponds to the periphery of a corresponding one of the circular regions in the second etching step S150, and the circular regions in the second etching step S150 have a larger diameter than the circular regions etched in the third etching step S170.

In the polysilicon layer removal step S180, the polysilicon layer is removed by an isotropic etch-back process, thereby fabricating a mushroom-shaped silicone mold having inverted mushroom-shaped holes for formation of a mushroom-shaped structure.

In the mushroom-shaped structure formation step S200, a mushroom-shaped structure, that is, the pillar 200 and the head 300, is formed by filling the inverted mushroom-shaped holes of the mushroom-shaped silicone mold with a polymer material, followed by curing. Specifically, the mushroom-shaped structure formation step S200 includes a casting step S210 and a curing step S220.

In the casting step S210, the inverted mushroom-shaped holes, which are etched regions of the silicon wafer, the polysilicon layer, and the silicon dioxide layer of the mushroom-shaped silicone mold, are filled with the polymer material.

In the curing step S220, the polymer material is cured. For example, when the polymer material is polydimethylsiloxane (PDMS), the polymer material may be cured by placing the mushroom-shaped silicone mold with the polymer material poured therein in an oven at 70° C.

The method may further include, before the mushroom-shaped structure formation step S200, a surface energy reduction step in which octafluorocyclobutane ($C_4F_8$) is deposited on the surface of the mushroom-shaped silicone mold to reduce surface energy of the mushroom-shaped silicone mold.

Here, the surface energy reduction step may be performed under $C_4F_8$ plasma at a standard flow rate of about 100 L/min and a pressure of 22 m Torr for 3 minutes.

In the surface fabrication step S300, the mushroom-shaped silicone mold is separated or removed from the cured polymer material, thereby obtaining a selective liquid sliding surface having the mushroom-shaped structures.

The method may further include, after the surface fabrication step S300, depositing octafluorocyclobutane ($C_4F_8$) on the mushroom-shaped structures to reduce surface energy of the selective liquid sliding surface according to the present invention.

The selective liquid sliding surface fabrication method according to the present invention is a method to fabricate the selective liquid sliding surface according to the present invention set forth above. For other details of the selective liquid sliding surface fabrication method, refer to description of the selective liquid sliding surface set forth above.

Although some embodiments have been described herein, it should be understood that these embodiments are provided for illustration only and are not to be construed in any way as limiting the present invention, and that various modifications, changes, and alterations can be made by those skilled in the art without departing from the spirit and scope of the invention.

INDUSTRIAL APPLICABILITY

The present invention can be applied to a selective liquid sliding surface which has omniphobicity, that is, a property of being super-repellent to both water and oil, and also a selective liquid rolling off property allowing oil to roll off faster than water through a mushroom-shaped surface structure having a reentrant structure at a head thereof contacting a liquid droplet.

The invention claimed is:

1. A method of fabricating a selective liquid sliding surface, the method comprising:
    a mushroom-shaped silicone mold fabrication step in which a mushroom-shaped silicone mold is fabricated;
    a mushroom-shaped structure formation step in which the mushroom-shaped silicone mold is filled with a polymer material, followed by curing; and
    a surface fabrication step in which a surface having mushroom-shaped structures is fabricated by separating the mushroom-shaped silicone mold from the polymer material,
    wherein the mushroom-shaped silicone mold fabrication step comprises:
    a photoresist layer formation step in which a photoresist layer is formed on an upper surface of a silicon wafer;
    a first etching step in which the photoresist layer is etched in a pattern of multiple rings arranged at regular intervals and the upper surface of the silicon wafer using the etched photoresist layer as a mask;
    a photoresist layer removal step in which the photoresist layer is removed;
    a polysilicon layer formation step in which a silicon oxide layer is deposited on the silicon wafer and a polysilicon layer is formed on the silicon oxide layer;
    a second etching step in which the entire region of the polysilicon layer excluding circular regions each corresponding to an outer periphery of a corresponding one of multiple ring-shaped trenches is etched;
    a silicon dioxide layer formation step in which a silicon dioxide layer is formed on the silicon oxide layer and the polysilicon layer;
    a third etching step in which circular regions of the silicon dioxide layer corresponding to the respective multiple ring-shaped trenches are etched; and
    a polysilicon layer removal step in which the polysilicon layer is removed.

2. The method according to claim 1, further comprising:
after the surface fabrication step,
a C$_4$F$_8$ deposition step in which octafluorocyclobutane (C$_4$F$_8$) is deposited on the mushroom-shaped structures.

3. The method according to claim 1, wherein the mushroom-shaped structure formation step comprises:
a casting step in which etched regions of the silicon wafer, the polysilicon layer, and the silicon dioxide layer of the mushroom-shaped silicone mold are filled with the polymer material; and
a curing step in which the polymer material is cured.

4. The method according to claim 1, wherein each of the multiple ring-shaped trenches formed in the first etching step corresponds to a periphery of a corresponding one of the circular regions in the second etching step, and the circular regions in the second etching step has a larger diameter than the circular regions etched in the third etching step.

5. The method according to claim 1, wherein the polymer material used in the mushroom-shaped structure formation step is any one selected from the group consisting of polydimethylsiloxane (PDMS), polyurethane acrylate (PUA), perfluoropolyether (PFPE), polyvinyl chloride (PVC), ethylene vinyl acetate (EVA), polyethylene (PE), polyethylene naphthalate (PEN), polypropylene (PP), polyolefin (PO), polymethyl methacrylate (PMMA), polystyrene (PS), nitrocellulose, acetyl cellulose, polycarbonate (PC), polyethylene terephthalate (PET), acrylonitrile-butadiene-styrene (ABS) resin, polyamide (PA), polyimide (PI), polyethersulfone (PES), polyvinyl acetal, polyetherketone (PEK), triacetylcellulose (TAC), pNIPAAm (poly(N-isopropylacrylamide)), Norland Optical Adhesive (NOA), and polyurethane (PU).

* * * * *